United States Patent [19]

Winick et al.

[11] Patent Number: 5,724,231
[45] Date of Patent: Mar. 3, 1998

[54] SUPPORT FOR ELECTRONIC CARDS AND BOARDS OF VARYING LENGTHS

[75] Inventors: Alan Lee Winick, San Jose; Clifford Willis, Tracy, both of Calif.; Dave Desilets, Hopkinton; James M. Carney, Pepperell, both of Mass.

[73] Assignee: Sun Microsystems, Inc., Mountain View, Calif.

[21] Appl. No.: 674,125

[22] Filed: Jul. 1, 1996

[51] Int. Cl.⁶ .................................................. H05K 5/00
[52] U.S. Cl. .................. 361/759; 361/726; 361/727; 361/732; 361/740; 361/747; 361/801; 361/802; 361/759; 439/377; 403/388; 403/405.1
[58] Field of Search ........................ 361/683, 720, 361/725–728, 731–733, 736, 740–742, 747, 756, 758, 759, 786, 802, 801; 439/951, 377; 292/67, 68; 403/388, 389, 405.1

[56] References Cited

U.S. PATENT DOCUMENTS

| | | |
|---|---|---|
| 5,036,313 | 7/1991 | Lin et al. ........................ 361/736 |
| 5,490,038 | 2/1996 | Scholder et al. ................ 361/759 |

*Primary Examiner*—Leo P. Picard
*Assistant Examiner*—Phuong Vu
*Attorney, Agent, or Firm*—Julian Caplan; Flehr, Hohbach, Test, Albritton & Herbert LLP

[57] ABSTRACT

Motherboards and cards (herein "boards") mounted in computer enclosures must be supported on X, Y and Z axes to resist shock and vibration. This requires that four edges of the board be supported. Because of the high cost of such boards their lengths are made as small as possible, and this dimension is the direction of insertion of the board. A guide is attached to the leading edge of the board having a depending foot which engages fasteners formed on the base of the chassis of the enclosure. Thus the inner edge of the board is supported along two axes. Two side edges of the board are held in tracks and the outer edge is held at the point of insertion.

9 Claims, 4 Drawing Sheets

SUPPORT FOR ELECTRONIC CARDS AND BOARDS OF VARYING LENGTHS

BACKGROUND OF THE INVENTION

1. Field of the Invention

This invention relates to a new and improved support for motherboards and cards (herein referred to as "boards") used in electronic equipment wherein the length of the board in one direction may vary. More particularly the invention relates to guides mounted in an enclosure, such as a computer enclosure, which support the four edges boards varying lengths in the X, Y and Z axes, even though the lengths of such boards may vary.

2. Description of Related Art

Computer equipment has in the past used enclosures in which various different types of components are mounted, including boards. In one type of mounting, tracks in the form of horizontal opposed channels receive the side edges of the board and another track receives the inner edge of the board while the outer edge of the board is supported at the point of insertion into the enclosure. This requires that the boards be of uniform lengths. The present invention differs in that a guide is snapped onto the inner edge of the board and has depending feet which engage guides formed on the base of the chassis and thereby restrain the inner edge along the axis of insertion of the board and in a vertical direction.

SUMMARY OF THE INVENTION

Conventional computer enclosures contain multiple products which require boards of different sizes. Because of the high cost of boards, it is desirable that the lengths thereof be limited to the length required and hence boards of different sizes are used. On the other hand, the board must be held in a secure manner so that its four edges are restrained in X, Y and Z axes. Thus industry standard shock and vibration requirements are met.

In accordance with the present invention, the motherboard, PCB or card (herein referred to as "board") is slid into an opening in the enclosure along what will be termed the "Y axis". The direction of insertion is co-planar with the board and the base of the enclosure, and the board is usually close to the base.

Two side edge guides, which are in the nature of inward facing, opposed channels and are mounted to the enclosure, engage the side edges of the board and restrain the side edges in the X axis (transverse to the direction of insertion of the board and parallel to the plane of the board) as well as along the Z (vertical) axis.

In accordance with the present invention a third card guide is snapped onto the leading edge of the board with respect to the direction of insertion and has depending feet which interlock with fasteners on the chassis base to retrain the board in the Y direction and in the Z direction.

The trailing edge of the board (considered in the direction of insertion) is attached to a plate which is secured in an opening in the rear of the enclosure, through which the board is inserted.

A preferred means for holding the leading edge card guide relative to the base of the chassis is a leg. On the bottom of the leg depending from the card guide is a foot which fits into a fastener struck up from the sheet metal of the base of the chassis.

BRIEF DESCRIPTION OF THE DRAWINGS

The accompanying drawings, which are incorporated in and form a part of this specification, illustrate embodiments of the invention and, together with the description serve to explain the principles of the invention.

DETAILED DESCRIPTION OF THE PREFERRED EMBODIMENT

Figure 1:
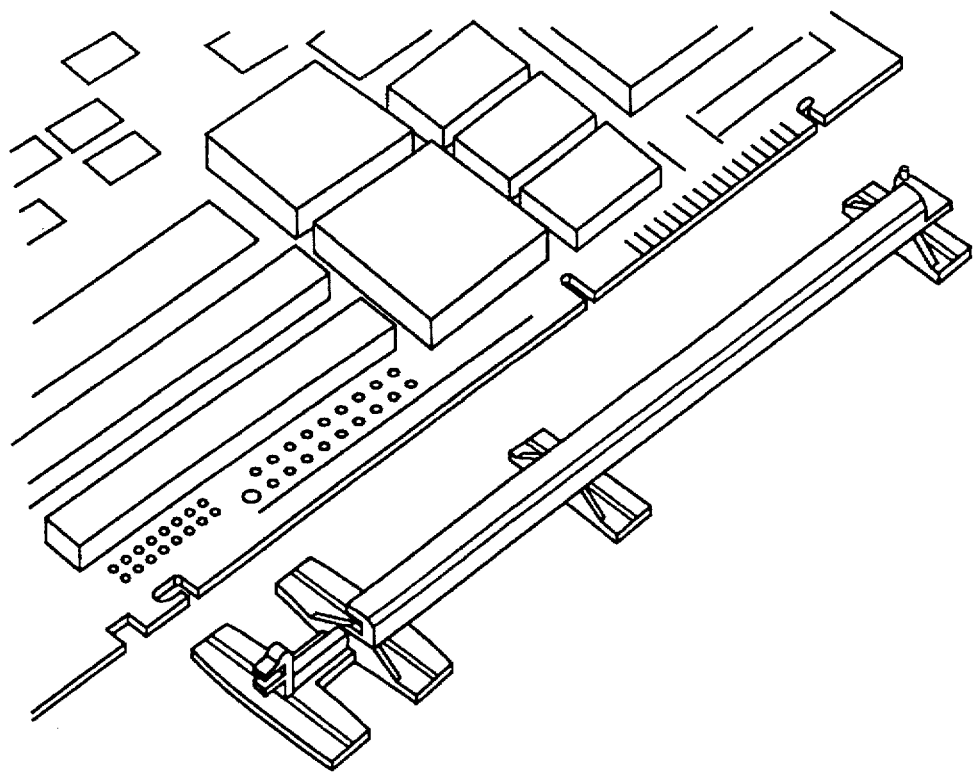
FIG. 1 is a perspective view of a portion of a board and a detached leading edge guide.
Figure 2:
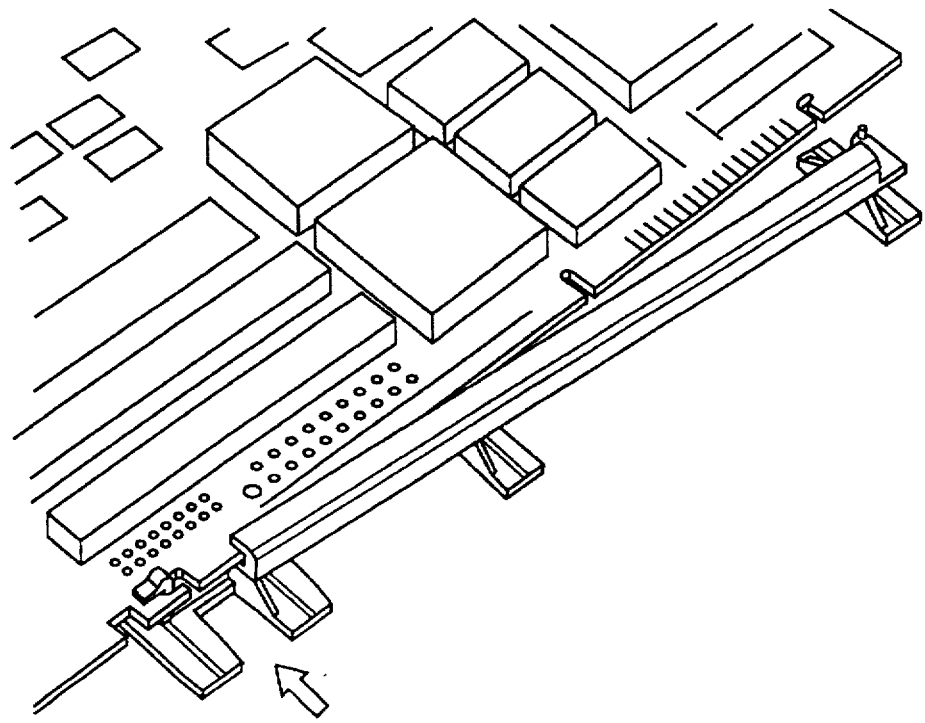
FIG. 2 shows the first step in attachment of the guide of FIG. 1.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

An enclosure for various electronic components has a chassis 11 having a back panel 12 upstanding from base 13. Back panel 12 is formed with an opening 14. The trailing edge of board 19 is connected to a plate 16 which fills opening 14 when board 19 is fully inserted.

When board 19 is inserted in the opening 14 in a horizontal direction parallel to base 13 it is deemed to move along the Y axis. Horizontal transverse movement (which is restrained in accordance with the present invention) is along the X axis. Vertical movement perpendicular to base 13 is considered the Z axis, and movement along the Z axis is likewise restrained as hereinafter explained.

Extending vertically relative to base 13 is right guide 21 or track which is in alignment with opening 14. Guide 21 comprises a vertical support 22 which is attached to base 13 by means not herein illustrated but well understood in the art. Facing horizontally inwardly is groove or channel 23 which has a vertical dimension equal to the thickness of board 19. Ramp 24 guides the right edge of board 19 into groove 23. On the opposite side of slot 17 is left guide 26 which also has a support 27 connected to base 13 and is formed with a groove 28 in horizontal alignment with groove 23 and spaced therefrom a distance equal to the width along the X axis of the board 19. Ramp 29 guides the leading edge of board 19 into the groove 23. It will thus be seen that when the board 19 is inserted through the opening 14 its left and right edges are confined within the grooves 23 and 28 and its trailing edge is held in plate 16 filling opening 14. The principal purpose of the present invention is to hold the leading edge 10 of board 19 relative to the Y and Z axes. It will be understood that the construction of board 19 may involve high cost. Hence it is desirable to make the length of such board as short as is commensurate with the components which are mounted on the board.

Figure 3:
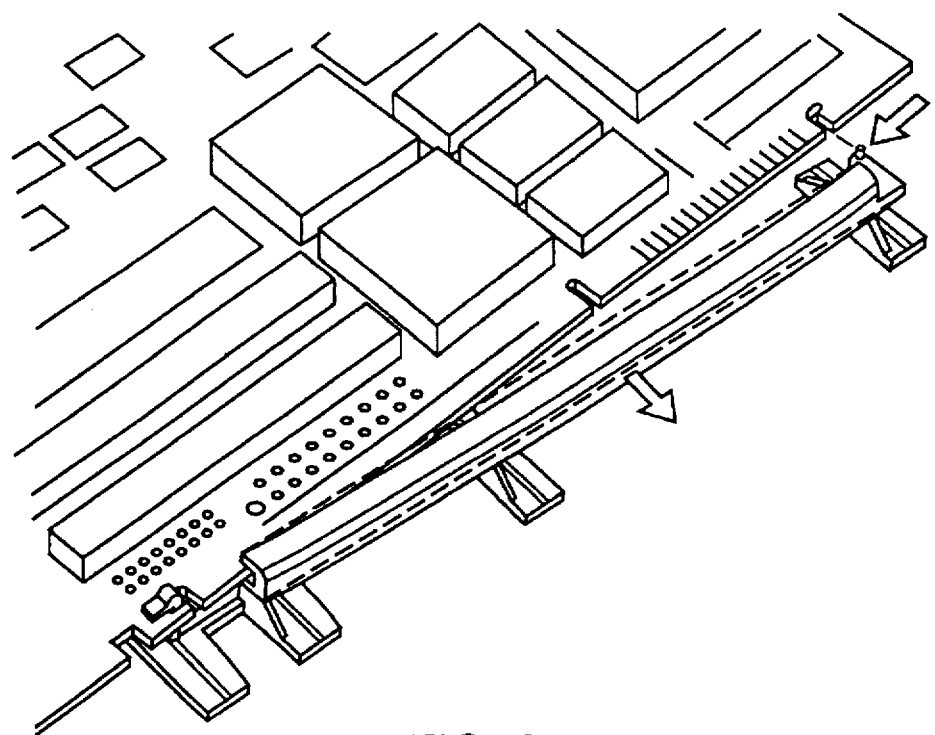
FIG. 3 shows a second step.
Figure 4:
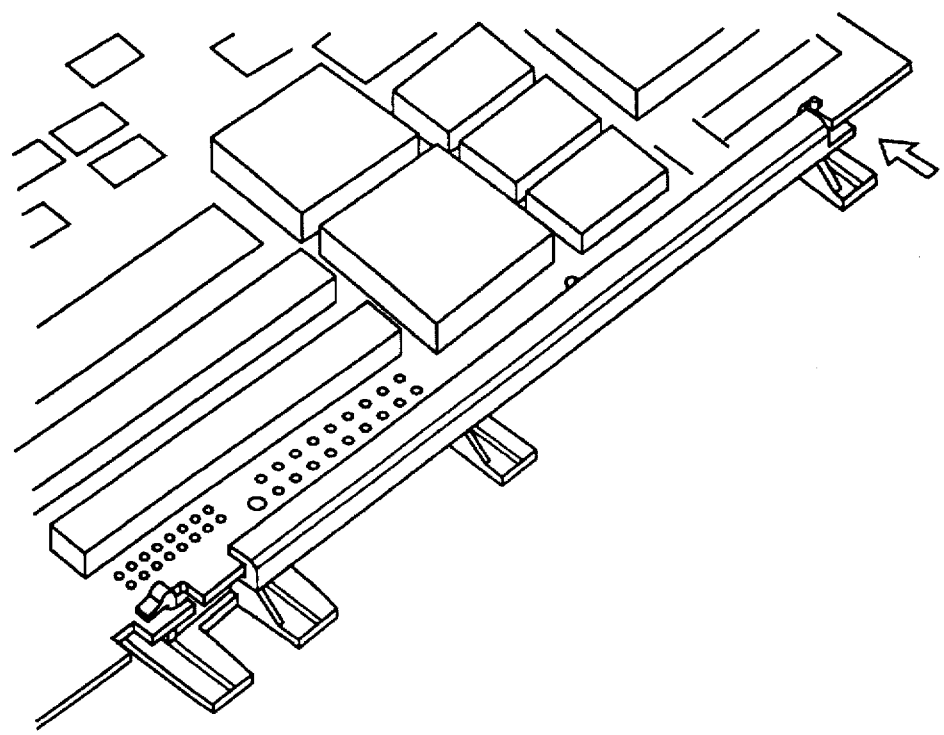
FIG. 4 shows completion of attachment of the leading edge guide.
Figure 5:
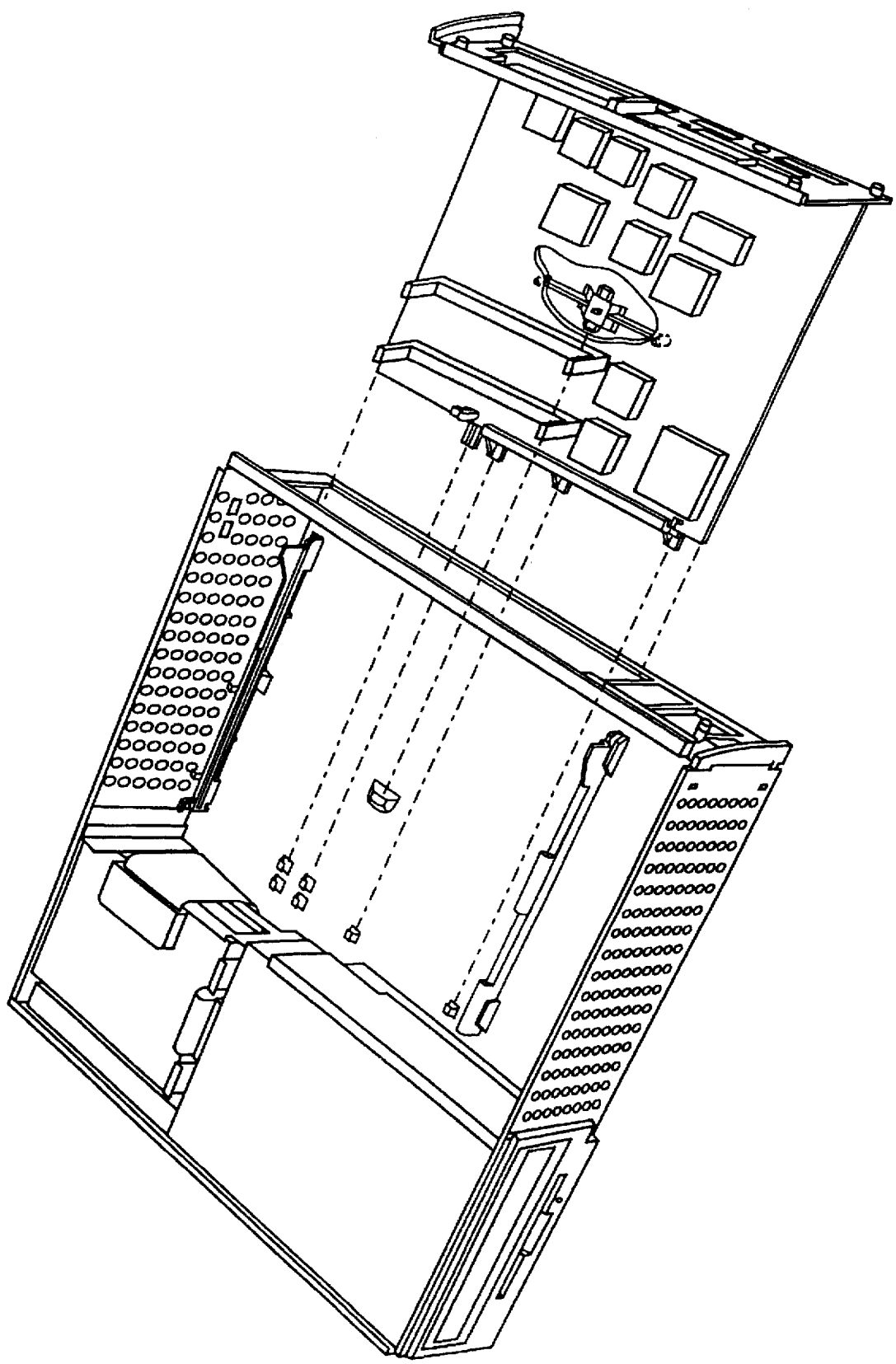
FIG. 5 is a perspective view showing an enclosure and board with leading edge guide attached, prior to assembly.
Figure 6:
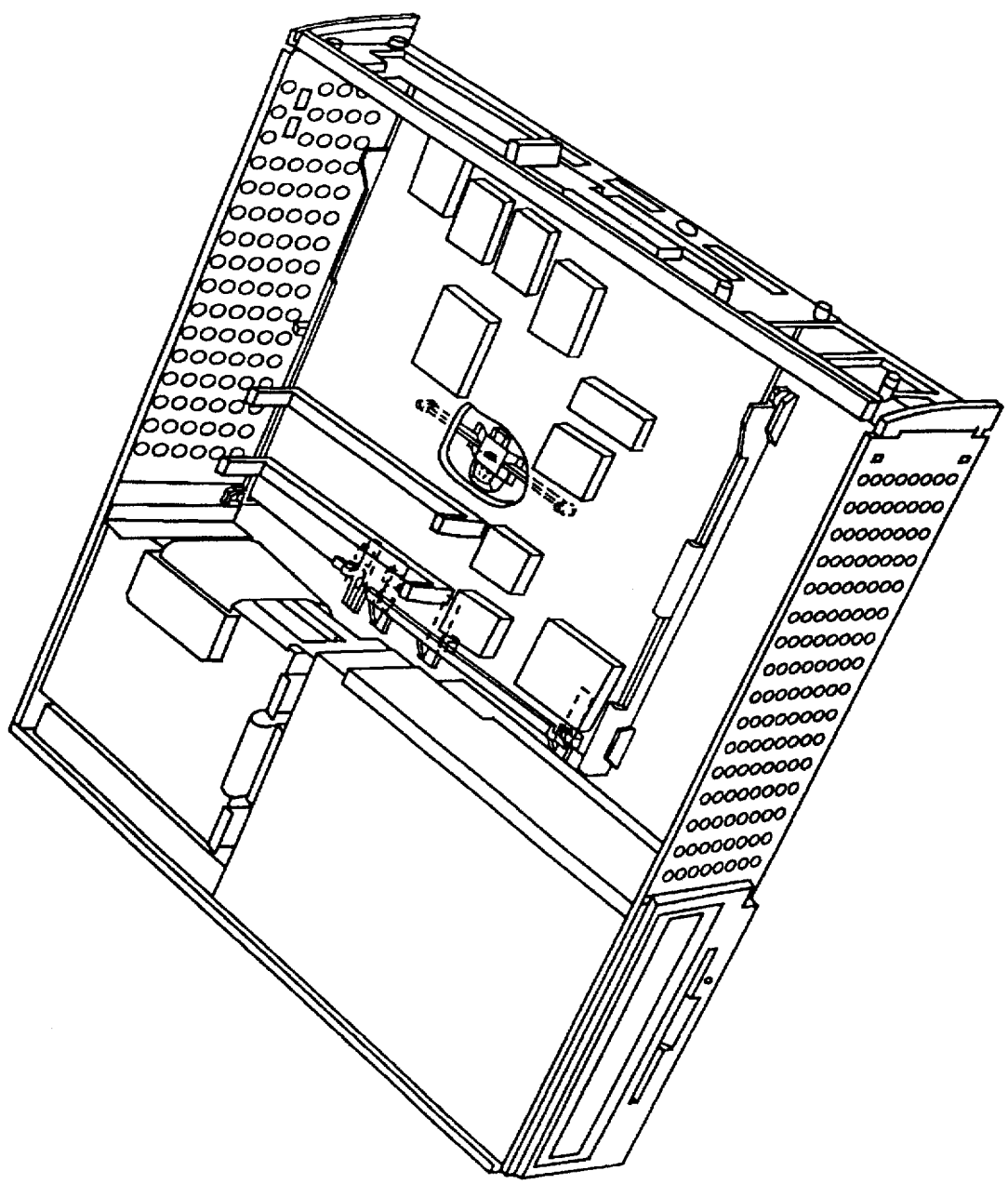
FIG. 6 shows completion of insertion of the board.

In order to support the leading edge 18 of board 19, a front edge guide 31 is employed. Laterally extending points 32 interconnected by vertical arm 33 are formed adjacent the left end of guide 31. Bayonet-type slot 34 is formed in board 19 so that the arm 33 may be inserted through the slot with the guide 31 generally parallel to board 19 and one point 32 above board 18 and the other point below board 19. A pin 36 is located on the right end of guide 31 opposite points 32. Pin 34 snaps into slot 37 in board 19. Because the distance between arm 33 and pin 36 is greater as compared with the distance between slots 34 and 37, guide 31 must be bowed outward (see FIG. 3) and then straightened (FIG. 4).

The rearward face of guide 31 has a channel 41 into which the leading edge of board 19 fits.

Extending downward from guide 31 are legs 43 having forward extending feet 44 at their lower ends which rest upon base 13. The base 13 is preferably of metal and struck up from the metal are hook-like fasteners 46. Each foot 44 slides into a fastener 46 which limits the inward movement of guide 31 and hence board 19. Legs 43 extend up from one edge of feet 44 and fasteners engage the edges of feet 44 opposite legs 43. Hence foot 44 slides under fasteners 46 regardless of the length of card 18. Hook stop 48 on the underside of board 19 engages fixed socket 49 on base 13 to limit inward movement. The hook 48 is positioned a fixed distance from the outer edge of card 18, regardless of the length thereof, and hence it engages sockets 49 to prevent vibration or "drumming" of the card. Because the fasteners 46 fit over the tops of feet 44, not only is the inward edge of board 19 restrained along the Y axis but also along the Z axis.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A front edge guide for securing a board in an enclosure, the board having a leading edge formed with slots and channel engaging means and the enclosure having a base and leg engaging means on the base, said guide comprising a channel shaped to detachably engage the leading edge, first means cooperable with the channel engaging means to hold said channel attached to the board, legs depending from said channel, and third means on said legs shaped to engage the leg-engaging means to limit movement of said guide relative to the enclosure along Y and Z axes, said first means comprising a pair of vertical elements shaped and positioned to be received in the slots, the distance between said elements being greater than the distance between the slots, said guide being flexible so that said guide bends vertically to permit insertion of one said element in a slot and then another said element in another slot and then pushed inwardly to seat said elements in the slots and said channel gripping the leading edge.

2. A guide according to claim 1 in which the leg engaging means include fasteners on the base and in which said third means comprises forward extending feet on the lower ends of said legs fitting under the fasteners.

3. In combination a board having a leading edge and channel engaging means, and an enclosure having a base, a panel upstanding from said base formed with an opening into which said board fits, and leg engaging means on said base, and a guide, said guide comprising a channel shaped to detachably engage said leading edge, first means cooperable with said channel engaging means to hold said channel attached to said board, legs depending from said channel, and third means on said legs shaped to engage said leg engaging means to limit movement of said guide relative to said base along Y and Z axes, said first means comprising a pair of vertical elements and said channel engaging means being formed with slots in said leading edge to receive said elements, the distance between said elements being greater than the distance between said slots, said guide being flexible so that said guide may bend vertically to permit insertion of one said element in one said slot and then another said element in another said slot and then pushed inward to seat said elements in said slots and said channel gripping said leading edge.

4. The combination of claim 3 which further comprises an enclosure having a base, a hook on said board and a socket on said enclosure to limit inward movement of said board relative to said enclosure.

5. The combination of claim 3 in which said leg engaging comprise fasteners struck up from said base.

6. The combination of claim 3 which further comprises a plate on a trailing edge of said board shaped to fit securely into said opening to restrain said trailing edge of said board along an X and a Z axis.

7. The combination of claim 3 which further comprises first and second side edge guides mounted on said base and positioned to engage opposed side edges of said board.

8. The combination of claim 7 in which said edge guides comprise horizontal, inward facing second channels.

9. The combination of claim 7 in which said edge guides are in alignment with opposed ends of said opening.

* * * * *